United States Patent
Huang et al.

(10) Patent No.: US 11,848,649 B2
(45) Date of Patent: Dec. 19, 2023

(54) LOW POWER VB CLASS AB AMPLIFIER WITH LOCAL COMMON MODE FEEDBACK

(71) Applicant: Micron Technology, Inc., Boise, ID (US)

(72) Inventors: Zhi Qi Huang, Shanghai (CN); Wei Lu Chu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/711,183

(22) Filed: Apr. 1, 2022

(65) Prior Publication Data

US 2023/0318536 A1 Oct. 5, 2023

(51) Int. Cl.
| | | |
|---|---|---|
| H03F 1/30 | (2006.01) | |
| H03F 3/26 | (2006.01) | |
| H03F 3/45 | (2006.01) | |
| H03F 3/21 | (2006.01) | |

(52) U.S. Cl.
CPC ............... *H03F 1/308* (2013.01); *H03F 3/21* (2013.01); *H03F 3/265* (2013.01); *H03F 3/45273* (2013.01)

(58) Field of Classification Search
CPC . H03F 1/308; H03F 3/21; H03F 3/265; H03F 3/45273
USPC .................................................. 330/252–261
See application file for complete search history.

(56) References Cited

U.S. PATENT DOCUMENTS

| | | | |
|---|---|---|---|
| 8,237,693 B2 * | 8/2012 | Nishimura | G09G 3/3688 330/252 |
| 10,170,992 B1 * | 1/2019 | Omole | H03F 3/45475 |
| 10,491,167 B1 * | 11/2019 | Far | H03F 3/04 |

\* cited by examiner

*Primary Examiner* — Hieu P Nguyen
(74) *Attorney, Agent, or Firm* — Fletcher Yoder, P.C.

(57) ABSTRACT

An amplifier includes a first stage and a second stage. The first stage includes a floating current source to maintain current within a threshold. The first stage also includes a local common mode feedback configured to provide gain to an input signal. Moreover, the second stage includes a driver that provides a load current to a load coupled to the amplifier.

19 Claims, 5 Drawing Sheets

LOW POWER VB CLASS AB AMPLIFIER WITH LOCAL COMMON MODE FEEDBACK

BACKGROUND

1. Field of the Invention

The present disclosure relates to the field of semiconductor devices, and more specifically, to an amplifier circuit that conserves space and reduces bias current without reducing amplifier drive.

2. Description of the Related Art

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a power amplifier is an electronic device that may increase the power of a signal, such a voltage or a current that may vary with time. In particular, the purpose of the amplifier is to produce an output signal that is larger than an input signal. The characteristics of the output signal may correspond to the characteristics of the input signal, but the output signal may also be sufficiently large enough to supply the load connected to the output of the amplifier. The amplifier may include a two-port circuit, such as a circuit with an input port and an output port. The amplifier may use electric power from a power supply to increase the amplitude of the input signal applied to the input port (e.g., input terminal of the amplifier) to produce a proportionally greater amplitude signal at the output port (e.g., output terminal of the amplifier). The amount of amplification provided by the amplifier is measured by gain, or the ratio of output to input voltage, current, or power. As such, the amplifier is a circuit having a power gain greater than one.

Generally, amplifiers may be distinguished by a respective class, which may refer to the circuit configuration and method of operation. For example, the class may relate to the time period or waveform that the amplifier is passing current. A class A amplifier may include a transistor (e.g., active element) that conducts through an entire period or waveform (e.g., the transistor conducts the full 360° of the waveform). On the other hand, a class B amplifier may include two complementary transistors that each conduct for half of the time period or waveform (e.g., the transistors each conduct 180° of the waveform). In particular, the transistors may be arranged so that one transistor dissipates or sinks current from the load to ground or a negative power supply, and the other transistor supplies or sources current to the load from a positive power supply (e.g., a "push-pull" arrangement). As such, each of the transistors may amplify the signal for only half of the output waveform. However, amplification using class B amplifiers often results in crossover distortion, where the non-linearity of the switching transistors do not vary linearly with the input signal. Specifically, the output signals from the two transistors may not combine together fully at the output halves of the waveform due to each of the transistors' unique zero cut-off biasing. The output signals not combining together occurs when the output signal changes or "crosses over" from one transistor to the other transistor at the zero voltage point (e.g., crossover point), producing an amount of "distortion" to the output signal.

A class AB amplifier also includes two transistors in which both transistors may operate simultaneously around the crossover point of the waveform (e.g., each of the transistors conduct between 180° and 360° of the waveform), eliminating crossover distortion often seen with the class B amplifier. Each of the two transistors of the class AB amplifier may conduct more than half of the time. For small power outputs, the class AB amplifier may operate as a class A amplifier but for high power outputs, the class AB amplifier may operate as a class B amplifier. This varying operation is provided by pre-biasing the two transistors in the output stage (e.g., providing a fixed current or voltage to the transistors to operate in a particular region of a transconductance curve). Thus, each transistor may conduct more than half but less than the entire period or waveform depending on the amount of current output and pre-biasing. That is, each transistor (e.g., push-pull transistors) of the class AB amplifier may conduct for slightly more than a half period of conduction of the class B amplifier but less than the entire period of conduction of the class A amplifier. Although the class AB amplifier generally results in low crossover distortion, amplification by the class AB may result in more distortion with respect to the class A amplifier. Additionally, the class AB amplifier may amplify less efficiently than other class amplifiers, especially since the class AB amplifier may waste power in a zero input condition.

BRIEF DESCRIPTION OF THE DRAWINGS

Various aspects of this disclosure may better be understood upon reading the following detailed description and upon reference to the drawings in which:

FIG. 3 is a schematic diagram illustrating an operational transconductance stage of the class AB amplifier of FIG. 1, in accordance with an embodiment;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, class AB amplifiers combine a class A amplifier and a class B amplifier to form an amplifier with two transistors (e.g., active elements) that conduct more than half a time period and that may conduct simultaneously. In a class AB operation, each of the two transistors of the class AB amplifier may operate similarly to the transistors in a class B amplifier over half of the waveform but may also conduct a small amount of voltage during the other half of the waveform. In particular, class AB amplifiers may bias duty cycles, causing the cycles for each of the transistors to overlap at a crossover point. The overlap may provide better control over any crossover distortion associated with the cycles. However, the class AB amplifier may trade efficiency for better linearity. That is, the class AB amplifier provides a smooth transition at the crossover point of the output signal in comparison to other classes, such as the class B amplifier. In this manner, the class AB amplifier may trade efficiency for lower distortion.

The systems and methods described herein disclose a class AB amplifier that is efficient without comprising distortion compensation. That is, in accordance with embodiments of the invention, a reduced-stage class AB amplifier is provided. More specifically, the disclosed AB amplifier includes only 2-stages and may be referred to as a "dual-stage amplifier." Using two stages rather than three may reduce the current utilized through the AB amplifier and also reduce the footprint (e.g., area) taken up by the AB amplifier. Additionally or alternatively to using 2-stages in the amplifier, a local common mode feedback configuration of the amplifier may be utilized to provide further current savings, such increased speed without consuming extra DC bias current. Although the following descriptions describe a class AB amplifier, which represents a particular embodiment, the systems and methods described herein may apply to any amplifier circuit (e.g., class B amplifiers and the like).

Figure 1:
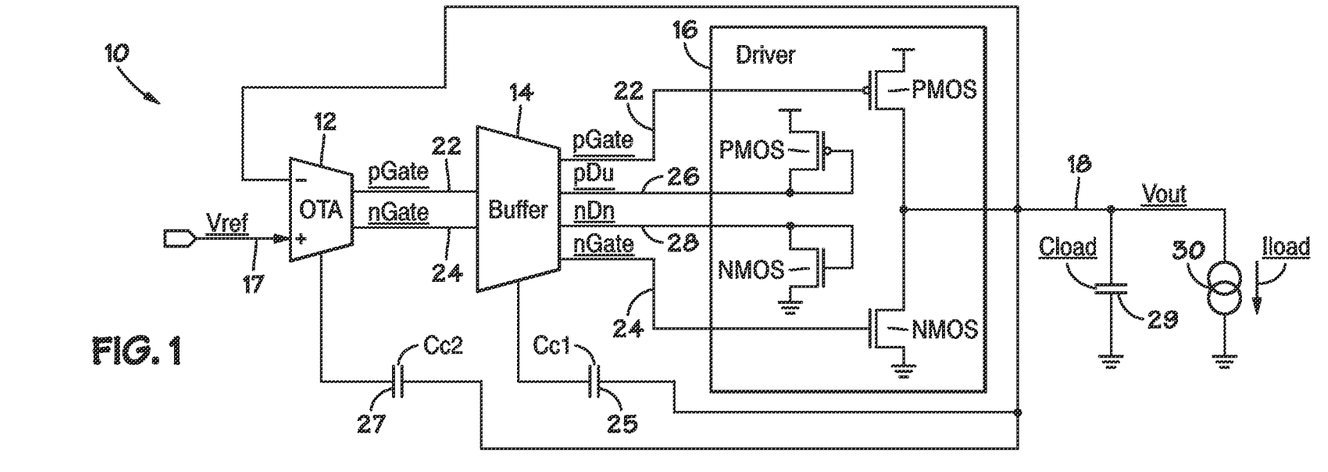
FIG. 1 is a schematic diagram illustrating stages of a class AB amplifier, in accordance with an embodiment.

Turning now to the figures, FIG. 1 is a schematic diagram illustrating stages of a class AB amplifier 10 (e.g., bit line pre-charge voltage (VBLP) class AB amplifier) for amplifying an input signal to an amplified output signal. As shown, the stages of the class AB amplifier 10 include an operational transconductance amplifier stage 12 (OTA stage) (e.g., an OTA), a buffer stage 14 (e.g., a buffer), and a driver stage 16 (e.g., a driver). That is, the class AB amplifier 10 may include three stages for providing the amplified signal. As will be discussed herein, the three stages may be reduced to two stages by removing and/or replacing circuitry from the buffer stage 14 to the OTA stage 12. Reducing the stages may result in improved efficiency for amplification, reduced amplification time, reduced circuit components, reduced current usage, and so forth.

Generally, the OTA stage 12 is an amplifier in which a differential input voltage produces an output current. Thus, the OTA stage 12 may be a voltage controlled current source. As shown, the OTA stage 12 may include a positive input and a negative input (e.g., input terminals). In particular, a voltage reference 17 (Vref) may connect to the positive input of the OTA stage 12, and a voltage output 18 may connect to the negative input of the OTA stage 12. The OTA stage 12 may output a positive gate signal 22 (pGate signal) and a negative gate signal 24 (nGate signal) that are both inputs to the buffer stage 14. The pGate signal 22 and the nGate signal 24 may enable passing or transmitting analog signals (e.g., voltage) to the next stage, such as the buffer stage 14.

Generally, the buffer stage 14 may provide electrical impedance transformation from one circuit to another, such as to prevent or reduce a signal source from being affected by currents or voltage for the load. As such, the buffer stage 14 interposed between the OTA stage 12 and the driver stage 16 may prevent or reduce the driver stage 16 from loading the output signal from the OTA stage 12 in an unexpected manner that may interfere with the intended functions of the driver stage 16 (e.g., adjust impedances). The buffer stage 14 may output the pGate signal 22, the nGate signal 24, a pDu signal 26, and an nDn signal 28 that may connect to respective transistors of the driver stage 16. Specifically, the buffer stage 14 may output these signals to respective PMOS transistors and NMOS transistors of the driver stage 16. The PMOS-NMOS complimentary pair of transistors may be referred to as a "push-pull" configuration of an amplifier, as previously discussed.

As previously mentioned, each of the complementary switching transistors of the driver stage 16 may amplify the input signal over half of the time period to ultimately provide an amplified current. The two amplified halves may be combined together to produce one full period or waveform at the voltage output 18. The class AB amplifier 10 may also include a first coupling capacitor 25 ($C_{C1}$), a second coupling capacitor 27 ($C_{C2}$), a load capacitor 29 ($C_{Load}$), and a load 30. The load 30 may have an associated load current ($I_{Load}$) and may include a circuit connected to and consuming power from the output port of the class AB amplifier 10. The first coupling capacitor 25 and the second coupling capacitor 27 may prevent or reduce interference, such as interference resulting from biasing voltage of the transistors of the driver stage 16. In particular, the coupling capacitors 25, 27 may decouple alternating current (AC) and direct current (DC) signals to not disturb a quiescent point (e.g., operating point of the class AB amplifier 10, bias point, or the steady-state DC voltage or current) of the circuit. The coupling capacitors 25, 27 may isolate DC signals from one stage to another (e.g., from the OTA stage 12 to the buffer stage 14, and the buffer stage 14 to the driver stage 16). In some embodiments, the load capacitor 29 may provide decoupling before current is provided to the load 30.

As previously discussed, the class AB amplifier 10 is biased so that the output current flows for less than one full cycle of the input waveform but more than half a cycle of the waveform. The transistors of the driver stage 16 are part of a complementary output stage with each transistor conducting on complementary or opposite half-cycles of the input waveform before being combined at the load 30. Thus, by allowing both switching transistors of the driver stage 16 to conduct current at the same time for a very short period, the output waveform during the zero crossover period may be substantially smoothed, reducing the crossover distortion otherwise associated with the Class B amplifier design. As such, the conduction angle from the transistors of the driver stage 16 may be greater than 180° (e.g., half a waveform) but smaller than 360° (e.g., full waveform). However, the Class AB amplifier 10 may be less efficient than other amplifiers, such as a Class B amplifier, because of the quiescent current used to bias the transistors just above a cut-off.

Figure 2:
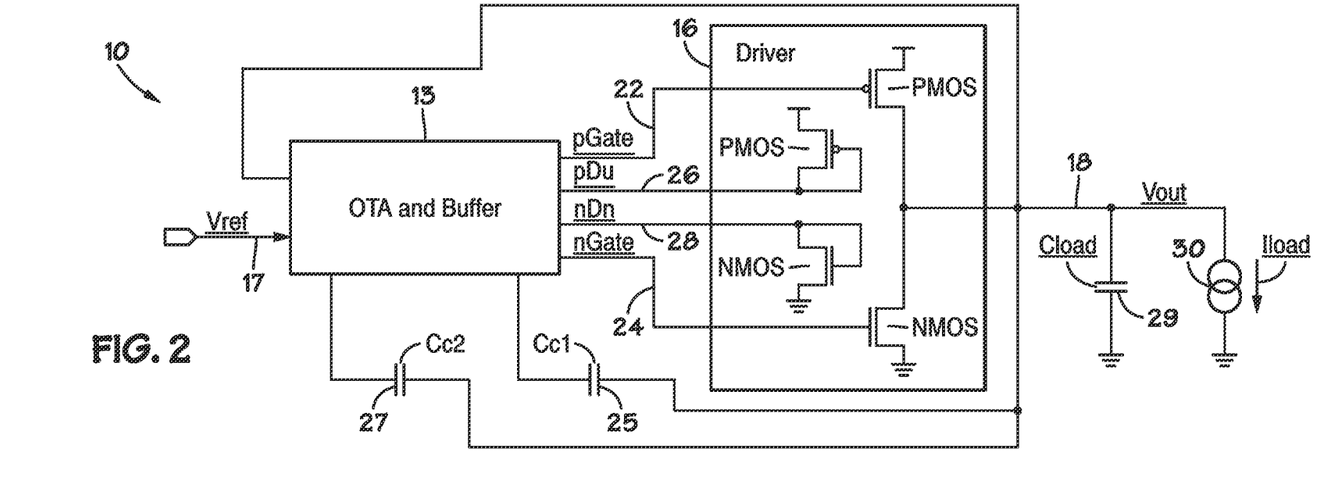
FIG. 2 is a schematic diagram illustrating a dual-stage amplifier, in accordance with an embodiment.

To provide a more efficient class AB amplifier, FIG. 2 is a schematic diagram illustrating a dual-stage amplifier 11, having a reduced number of stages (e.g., 2 stages) compared to the class AB amplifier 10 of FIG. 1, in accordance with embodiment of the invention. Specifically, in the dual-stage amplifier 11, the circuitry and operations performed by the OTA stage 12 and the buffer stage 14 are combined and reduced into a single stage of an OTA and buffer stage 13 (e.g., integrated OTA stage 12 and buffer stage 13). Thus, functions discussed with respect to the OTA stage 12 and the buffer stage 14 of FIG. 1 may be performed in the OTA and buffer stage 13. As shown, the dual-stage amplifier 11 may amplify the input signal in two stages (e.g., the OTA and buffer stage 13 and the driver stage 16) rather than three stages. Moreover, as will be discussed herein, a floating current source of the buffer stage 14 may be moved to the OTA stage 12, such that the OTA stage 12 and the buffer stage 14 are combined and reduced into the OTA and buffer stage 13. By reducing the stages from three stages to two stages (e.g., dual-stage), the current consumption may be reduced by at least 20-30% (e.g., 29%).

For comparison, FIG. 3 is a schematic diagram illustrating the OTA stage 12 of the class AB amplifier 10 of FIG. 1. As shown, the OTA stage 12 may include differential transistor pairs and current mirror pairs. In particular, the OTA stage 12 includes a first transistor 40 (M1) and a second transistor 42 (M2) that make up a differential input pair. Moreover, a third transistor 44 (M3) and a fifth transistor 48 (M5) may make up a current mirror, a fourth transistor 46 (M4) and a sixth transistor 50 (M6) may make up a current mirror, and a seventh transistor 52 (M7) and an eighth transistor 54 (M8) may make up a current mirror. The current mirror transistors (e.g., M3-M8) may convert a differential input signal to a single-ended output signal as the nGate signal 24. Moreover, since the configuration or circuit structure of the OTA stage 12 is symmetrical, the input offset voltage may be small (e.g., less than 5 millivolts (mV)).

A voltage biasing transistor 56 (M9) ($V_{bias}$) may provide a bias current or voltage (e.g., a constant gate voltage), as previously discussed. By way of example, the voltage biasing transistor 56 may enable providing a biasing voltage to transistors in the output stage of the class AB amplifier 10, for example, to reduce crossover distortion. Additionally, the OTA stage 12 may include a positive supply voltage 58 (VDD) (e.g., first voltage rail) and a negative supply voltage 59 (VSS) or ground voltage (e.g., second voltage rail). The positive supply voltage 58 and the negative supply voltage 59 may be used provide a particular amount of voltage at the output, such as at the nGate signal 24. The particular voltage may be a voltage between the positive supply voltage 58 and the negative supply voltage 59 using the eighth transistor 54 (M8) and the sixth transistor 50 (M6).

Generally, as the current flowing into the OTA stage 12 increases, the output response from the class AB amplifier 10 may be produced faster. In particular, a ratio of N corresponds to the gain of the input voltage to the output current (e.g., gain applied to the input voltage to provide an amplified input signal as the output signal). The ratio of N is associated with the pair of current mirror transistors (e.g., M3-M8), and thus, the ratio of N may be adjusted to increase the amplification or speed for producing the output signal.

By way of example, the current flowing into the sixth transistor 50 (M6) and the eight transistor 54 (M8) at the output of the OTA stage 12 may drive the buffer stage 14. Thus, a relatively larger current at the output from the sixth transistor 50 (M6) and the eight transistor 54 (M8) may drive the gate of the buffer stage 14 faster than a relatively smaller current so that the response from the buffer stage 14 is produced faster. The nGate signal 24 is a net total of capacitive loading, so a large current may drive capacitive loading faster. However, the tradeoff of increasing N includes power consumption (e.g., greater power is consumed to increase N) and a large circuit layout (e.g., large number of transistors and current mirrors in the circuit of the class AB amplifier 10).

Figure 4:
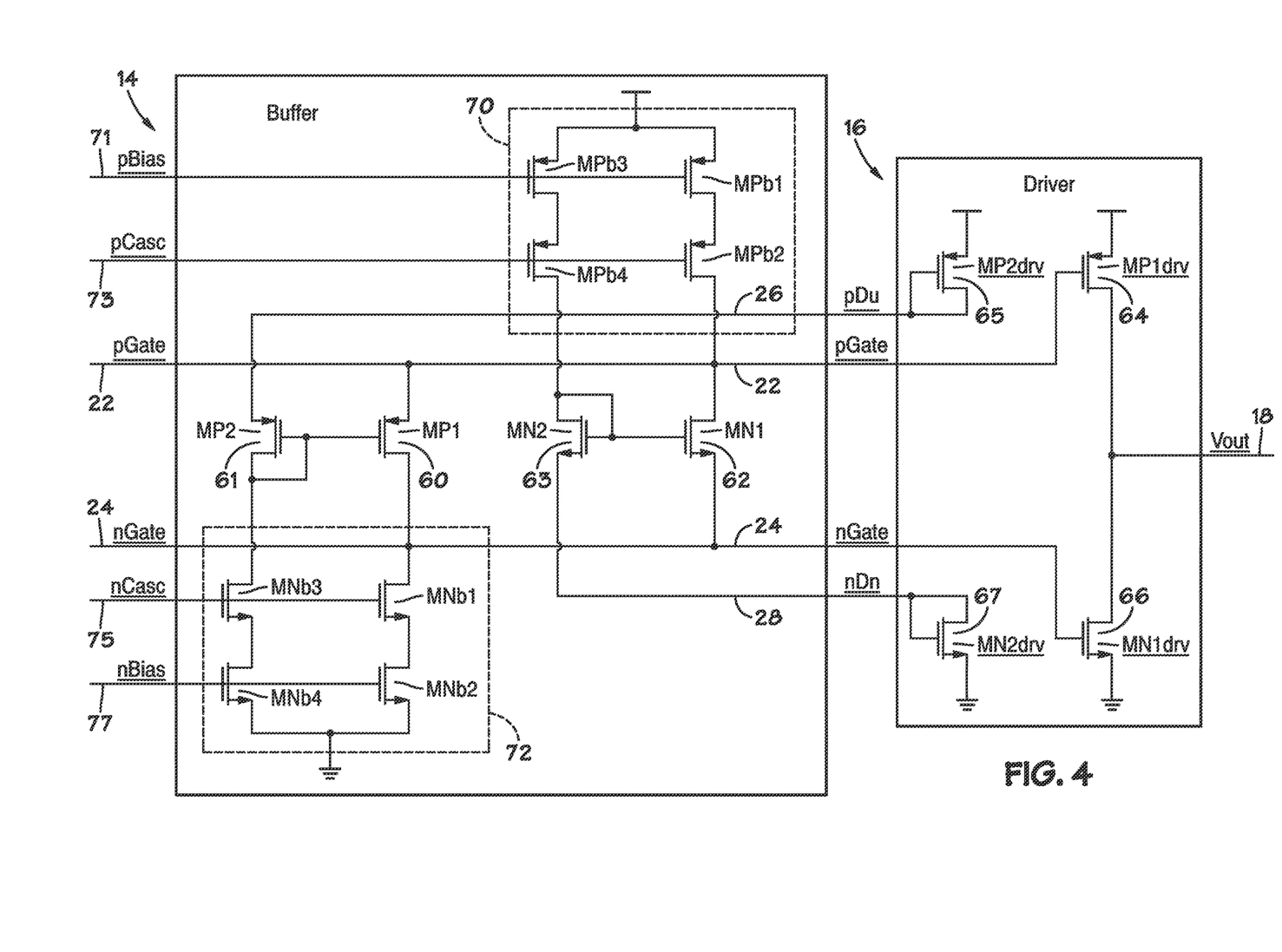
FIG. 4 is a schematic diagram illustrating a buffer stage and a driver stage of the class AB amplifier of FIG. 1, in accordance with an embodiment.

Further, FIG. 4 is a schematic diagram illustrating a buffer stage 14 and a driver stage 16 of the class AB amplifier 10 of FIG. 1. Generally, the buffer stage 14 facilitates driving the pGate signal 22 and the nGate signal 24 to adjust the voltage output 18 that is outputted from the driver stage 16. The buffer stage 14 may include a transistor 60 (MP1) and a transistor 61 (MP2) (e.g., PMOS transistors), as well as a transistor 62 (MN1) and a transistor 63 (MN2) (e.g., NMOS transistors). The transistor 60 and the transistor 62 may be complementary transistors that make up or couple to a floating current source. Similarly, the transistor 61 and the transistor 63 may be complementary transistors that make up or couple to the floating source. Generally, floating current sources constructed using sink and source drivers (e.g., current mirror transistors) may have better performance and higher output impedance than grounded-load (single-ended) current sources.

The current flowing through the transistors 60, 61, 62, and 63 are from biasing current from a first cascaded current mirror 70 (e.g., current mirror transistor pairs) of a top portion of the buffer stage 14 (e.g., associated with the PMOS transistor of the class AB amplifier 10) and a second current cascaded current mirror 72 for a bottom portion of the buffer stage 14 (e.g., associated with the NMOS transistor of class AB amplifier 10). The first cascaded current mirror 70 includes four transistors, such as transistors as MPb1, MPb2, MPb3, and MPb4, to form two current mirror transistor pairs (e.g., MPb1 and MPb3 as a current mirror pair). Similarly, the second cascaded current mirror 72 includes four transistors, such as MNb1, MNb2, MNb3, and MNb4, to form two current mirror transistor pairs. The buffer stage 14 may provide bias voltages to bias respective transistors of the cascaded current mirrors 70, 72, such as a pBias voltage 71 and an nBias voltage 77. The buffer stage may also provide cascode voltages, a pCasc voltage 73 and an nCasc voltage 75, that may also be bias voltages for biasing respective transistors.

As shown, the floating current source from the transistor 60 and the transistor 62 is positioned between the pGate signal 22 and the nGate signal 24 (dual-ended output). Both the transistor 60 and the transistor 62 are positioned in parallel and inserted between the pGate signal 22 and the nGate signal 24, so that if different current profiles are received, the pGate signal 22 and the nGate signal 24 may slightly increase or decrease but generally maintain a certain voltage drop within a threshold (e.g., because of the transistor 60 and the transistor 62 in the push-pull amplifier configuration). The transistors 61 and 63 may operate similarly to the transistors 60 and 62 (e.g., provide a push-pull amplifier configuration).

The pGate signal 22 (e.g., net signal) and the nGate signal 24 (e.g., net signal) may provide a certain voltage difference (e.g., $V_{ts}$). Specifically, the transistor 60 and the transistor 62 (e.g., and the transistor 61 and the transistor 63) may provide a current floating source to realize the voltage difference regardless of the current profile floating in the voltage output 18. The voltage difference between the pGate signal 22 and the nGate signal 24 may prevent or reduce any cross-back current flowing between driving transistors, such as a driving transistor 64 (MP1*drv*) associated with the pGate signal 22 and a driving transistor 66 (MN1*drv*) associated with the nGate signal 24, as well as between a driving transistor 65 (MP2*drv*) associated with the pGate signal 22 and a driving transistor 67 (MN2*drv*) associated with the nGate signal 24.

If the nGate signal 24 and the pGate signal 22 have the same voltage level, when the voltage is at an intermediate level caused by the same voltage, the current may not be pushed up in amplification or pulled down in application, and may also waste current and power.

Additionally, the transistor 60 and the transistor 62 may bias the pGate signal 22 and the nGate signal 24 without cross-back current flowing between the driving transistor 64 (MP1*drv*) and the driving transistor 66 (MN1*drv*) during normal operation. Similarly, the transistor 61 and the transistor 63 may bias the pGate signal 22 and the nGate signal 24 without cross-back current flowing between the driving transistor 65 (MP2*drv*) and the driving transistor 67 (MN2*drv*) during normal operation. Moreover, a dead zone and signal distortion may be reduced or removed. Additionally, the buffer stage 14 may include the pDu signal 26 and the nDn signal 28 that may connect to respective transistors of the driver stage 16, as previously discussed with respect to FIG. 1. Specifically, the buffer stage 14 may output these signals to respective PMOS transistors and NMOS transistors of the driver stage 16, such as the driving transistor 64 (MP1*drv*), the driving transistor 65 (MP2*drv*), the driving transistor 66 (MN1*drv*), and the driving transistor 67 (MN2*drv*).

The driving transistors 64 and 65 may be pmos drivers that may provide a pull-up function (e.g., a pull-up driver). To provide a large output at the voltage output 18 (e.g., between 10 and 20 milliamps (mA), such as 15 mA), the driving transistors 64 and 65 may be configured to cause current to flow towards the driving transistors 66 and 67, respectively, so that the driver stage 16 is charged up. By way of example, if the voltage output 18 is large or increases for a smaller load, the driving transistors 66 and 67 may discharge the current to reduce the voltage output 18. That is, the driving transistors 64 and 66 (e.g., and the driving transistors 65 and 67) provide a pull-up or a pull-down function for the driver stage 16. If the driving transistor 64 is functioning as intended in the pull-up configuration, the driving transistor 66 in the pull-down configuration may be closed. The driving transistors 65 and 67 may operate similarly. By way of example, the nGate signal 24 may be low or reduced (e.g., to as low as possible) by the driving transistor 66. In some embodiments, the driving transistor 66 may be off but the driving transistor 64 may be fully enabled to facilitate a fast response and stronger pull-up capability. Alternatively, the driving transistor 64 may be off or low but the driving transistor 66 may be fully enabled to facilitate a fast response and stronger pull-down capability. The transistors 65 and 67 may function similarly to provide the pull-up or the pull-down capabilities.

Generally, to pull up or to pull down, the nGate signal 24 may be adjusted to be as high as possible (e.g., approximately supply voltage rail, which may be based on external supply voltage level) and the pGate signal 22 may be adjusted to be as high as possible to maintain a voltage difference between the nGate signal 24 and the pGate signal 22. The voltage difference may be maintained to generally provide a current for the voltage output 18. If the pGate signal 22 and the nGate signal 24 are at intermediate levels, both the pGate signal 22 and the nGate signal 24 will be on, causing large current to flow into each other, and resulting in cross-back current that causes distortion and wastes power, as well as results in zero current flowing into the voltage output 18. When there is no current at the voltage output 18, the pGate signal 22 and the nGate signal 24 are low. In particular, only some biasing current would flow when a large bias current maintains the voltage output difference.

As previously discussed, the buffer stage 14 may also include current cascaded current mirrors such as the first cascaded current mirror 70 and the second current cascaded current mirror 72. The first and second cascaded current mirrors 70, 72 may ensure that the voltage output 18 is large (e.g., large as possible for the amplifier). A large voltage may provide higher gain. However, as previously discussed, the class AB amplifier 10 may be relatively less efficient in amplifying signals than other class amplifiers.

Figure 5:
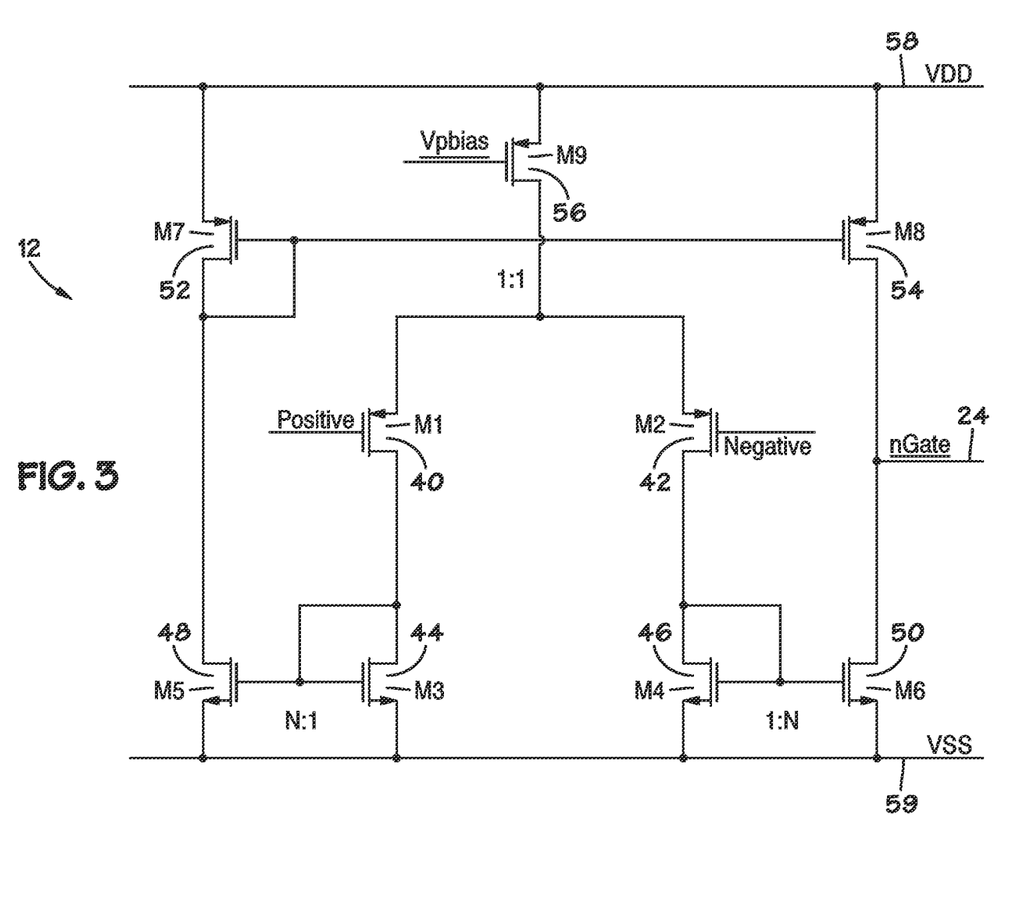
FIG. 5 is a schematic diagram illustrating an improved operational transconductance stage of the class AB amplifier, compared to FIG. 3, utilizing a local common mode feedback, in accordance with an embodiment.

To increase efficiency of the class AB amplifier 10, FIG. 5 is a schematic diagram of the OTA stage 12 of FIG. 4 utilizing a local common mode feedback circuit 80 that may be utilized in the dual-stage amplifier 11, in accordance with embodiments of the invention. As shown by the bolded lines in the circuit, the OTA stage 12 includes a floating current source and a local common mode feedback. In particular, the OTA stage 12 includes the floating current source rather than the buffer stage 14 (so that the functions of the OTA stage 12 and the buffer stage 14 are combined into the OTA and buffer stage 13). The OTA stage 12 includes the pGate signal 22 and the nGate signal 24 from the buffer stage 14 rather than just the nGate signal 24.

Additionally, the OTA stage 12 includes a local common mode feedback circuit 80 (indicated by the long dashed line box) that provides a relatively higher DC gain and lower DC bias current with respect to the OTA stage 12 of FIG. 3, and provides the higher DC gain without a tradeoff of amplifier response speed. As will be discussed herein, the local common mode feedback may provide gain to an input signal, decrease a DC bias current, and/or maintain or increase amplification to provide an output signal.

Effectively, the OTA stage 12 and/or the buffer stage 14 are cut. The pGate signal 22 and the nGate signal 24 of a floating current source that were connected to the transistor 60 (MP1) and the transistor 62 (MN1) (e.g., of the buffer stage 14 of FIG. 4 prior to the cut) are inserted between the complementary pair of the eighth transistor 54 (M8) and the sixth transistor (M6). Placing the eighth transistor 54 (M8) and the sixth transistor (M6) may provide the DC bias current to the floating current source instead of the cascaded current mirrors 70, 72 (e.g., of the buffer stage 14 of FIG. 4). In this manner, the cascaded current mirrors 70, 72 are used to provide the DC current flowing into transistor 60 (MP1) and the transistor 62 (MN1). That is, the transistor 60 (MP1) and the transistor 62 (MN1) from the buffer stage 14 is removed from the buffer stage 14 and inserted into the OTA stage 12. In some embodiments, the OTA and buffer stage 13 does not utilize the cascaded current mirrors 70, 72. Thus, the number of transistors may be reduced, conserving space in the circuit layout.

The local common mode feedback circuit 80 may include a diode connected transistor with a first resistor 82 (R1) and a second resistor 84 (R2). Generally, for a push-pull configuration of an amplifier, local common feedback may not be utilized. Cascaded current mirrors 70, 72 of FIG. 4 that are DC biased may provide a large DC gain, which corresponds to accuracy of the amplification. As will be discussed below with reference to FIG. 6, the OTA and buffer stage 13 may not include the cascaded current mirrors 70, 72. As a result, some DC gain may be lost due to the removal of the current mirror transistors from the buffer stage 14, and as such, DC gain may be compensated for elsewhere. For example, since the cascaded current mirrors 70, 72 are removed, reducing DC current gain, the DC current gain may be compensated for in the OTA stage 12. In particular, the local common mode feedback circuit 80 may compensate for the removed cascaded current mirrors 70, 72 and provide the higher gain in the OTA stage 12 so that the DC gain loss in buffer stage 14 can be regained.

Additionally, the local common mode feedback circuit 80 may be used to increase amplification speed. In particular, since the current mirror is removed, the ratio of M to N may not be utilized and instead, M to 1 may be utilized to facilitate receiving more DC current. Another benefit of the local common mode feedback circuit 80 is that at least one branch of current may be removed (as indicated by the dashed line). Specifically, the current at the eighth transistor (M8) 54 and the sixth transistor (M6) 50 of FIG. 4 may facilitate sharing the DC current and combine the transistor branches into a single branch. Utilizing the local common mode feedback circuit 80 in the dual-stage amplifier 11 may reduce power consumption (e.g., save power) by 20-30% (e.g., 21%). Similarly, a nested miller capacitor (not shown) that is often used in an amplifier (e.g., the class AB amplifier 10), for example, to overcome phase degradation introduced by cascading stages, may be removed from the dual-stage amplifier 11, reducing the overall size of the circuit.

Figure 6:
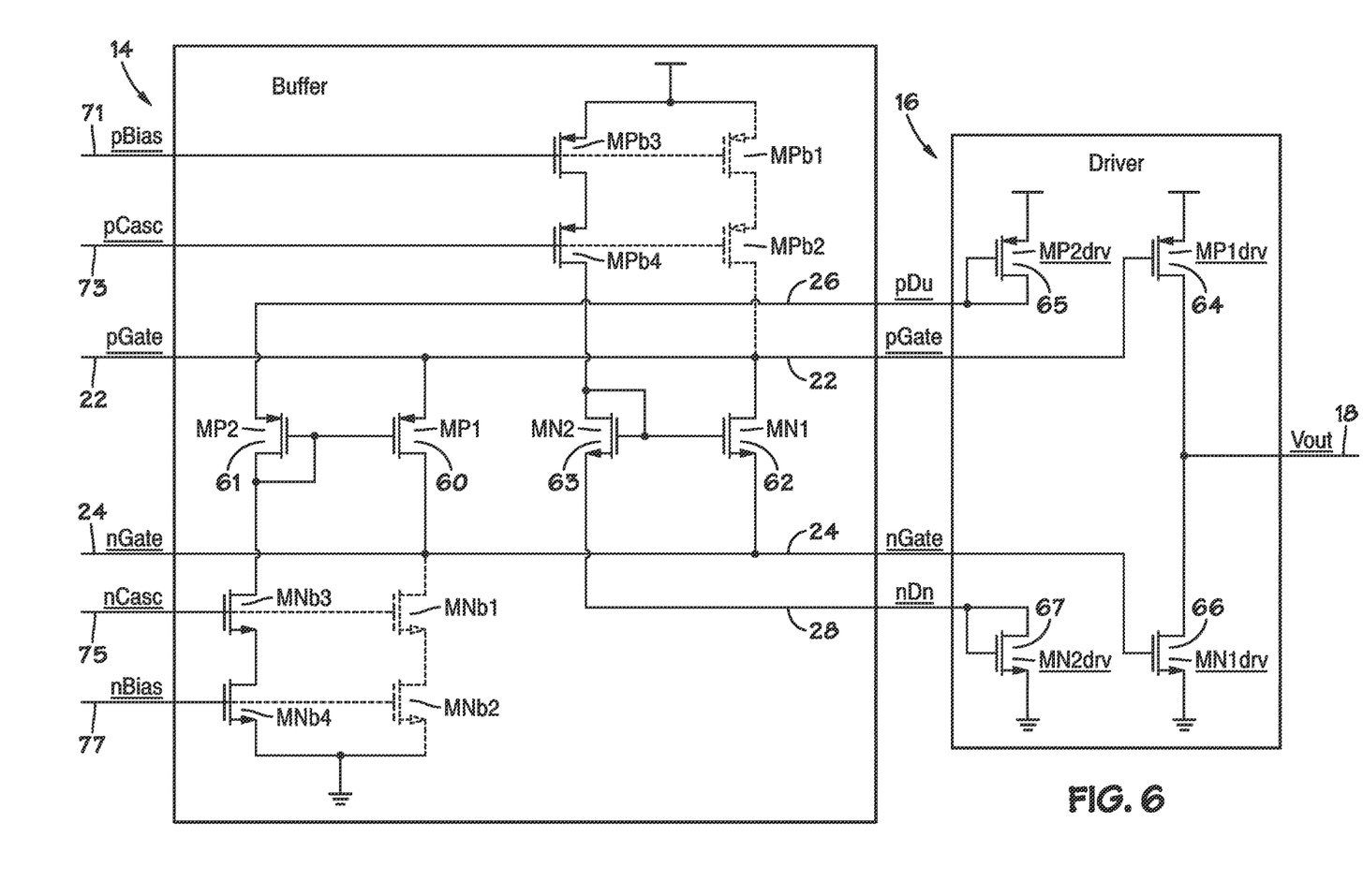
FIG. 6 is the schematic diagram illustrating the buffer stage and the driver stage of the class AB amplifier, compared to FIG. 4, with a floating current source and reduction in transistors, in accordance with an embodiment.

FIG. 6 is the schematic diagram illustrating the buffer stage 14 and the driver stage 16 of the dual-stage amplifier 11 with a floating current source and reduction in transistors with respect to buffer stage 14 and the driver stage 16 of FIG. 4. As previously discussed, the cascaded current mirrors 70, 72 may be removed due to the floating current source biased in the OTA stage 12. Removing the transistors of the cascaded current mirrors 70, 72 may reduce the DC bias current and simplify the compensation.

Since the cascaded transistors are not in the signal pathway, only DC bias current may pass through the signal pathway in a single stage (e.g., rather than two stages of the OTA stage 12 and the buffer stage 14). Thus, the dual-stage amplifier 11 described herein generally includes portions of buffer stage 14 being removed and replaced or compensated for in the OTA stage 12, thereby providing an OTA and buffer stage 13. As such, amplification stages may be reduced, component and circuit layout size may be reduced, and the gain may be a one-to-one ratio rather than one-to-N, reducing power consumption. The reduced amplifications stages may also facilitate removing a branch of transistor, as well as removing any miller compensation capacitors. As such, the circuit layout dimensions (e.g., footprint) may be reduced. Similarly, the reduced stages may correspond to reduced circuit size (e.g., footprint). Additionally, the lower gain resulting from removal of the cascaded transistors may be compensated for using local common mode feedback, which generally is not used in a push-pull amplifier. Moreover, the DC bias current may be reduced without drivability loss because of the local common mode feedback. Such designs may be beneficial for usage in memory devices such as Dynamic Random Access Memory (DRAM) devices.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. An amplifier, comprising:
 a first stage, comprising:
  a floating current source configured to maintain current within a threshold; and
  a local common mode feedback configured to provide gain to an input signal, wherein the local common mode feedback is configured to provide a dual-ended output; and
 a second stage comprising a driver, the driver configured to provide a load current to a load coupled to the amplifier.

2. The amplifier of claim 1, wherein the first stage is configured to receive a differential input voltage and generate an output current.

3. The amplifier of claim 1, wherein the floating current source is coupled to a pair of complementary transistors.

4. The amplifier of claim 1, wherein the floating current source is biased in the first stage.

5. The amplifier of claim 1, wherein the amplifier comprises a class AB amplifier.

6. The amplifier of claim 1, wherein the local common mode feedback comprises a pair of transistors coupled to one or more resistors.

7. The amplifier of claim 1, wherein the local common mode feedback is configured to decrease a DC bias current, maintain or increase amplification to provide an output signal, or any combination thereof.

8. The amplifier of claim 1, wherein the first stage comprises an integrated operational transconductance (OTA) and buffer stage.

9. A method, comprising:
 receiving an input signal at a push-pull amplifier;
 applying a bias current to a floating current source of the push-pull amplifier using a pair of current mirror transistors coupled to an output of the push-pull amplifier;
 applying a gain to the input signal using at least a local common mode feedback; and
 sending an output signal based at least in part on the input signal and the gain.

10. The method of claim 9, wherein the push-pull amplifier is a class AB amplifier.

11. The method of claim 9, wherein the local common mode feedback provides a gain and response speed functionality corresponding to a plurality of cascaded current mirror transistors.

12. A dual-stage amplifier, comprising:
 an integrated operational transconductance (OTA) and buffer stage, comprising:
  a floating current source of a positive gate signal and a negative gate signal disposed between a first transistor and a second transistor of a current mirror pair of transistors; and
  a local common mode feedback circuit configured to provide gain to an input signal and decrease bias current; and
 a driver stage comprising a driver, the driver is configured to provide the input signal with gain as an output signal to a load coupled to the dual-stage amplifier.

13. The dual-stage amplifier of claim 12, wherein the dual-stage amplifier comprises a bit line pre-charge voltage (VBLP) class AB amplifier.

14. The dual-stage amplifier of claim 12, wherein the local common mode feedback circuit comprises a pair of transistors coupled to one or more resistors.

15. The dual-stage amplifier of claim 12, wherein the current mirror pair of transistors are coupled to driver.

16. The dual-stage amplifier of claim 12, wherein the local common mode feedback circuit provides a functionality corresponding to a plurality of cascaded current mirror transistors.

17. The dual-stage amplifier of claim 12, wherein the local common mode feedback circuit is configured to provide a dual-ended output.

18. The dual-stage amplifier of claim 12, wherein the local common mode feedback circuit is configured to provide gain to an input signal, decrease a DC bias current, maintain or increase amplification to provide an output signal, or any combination thereof.

19. The dual-stage amplifier of claim 12, wherein the dual-stage amplifier is a push-pull amplifier.

* * * * *